(12) United States Patent
Chowdhury et al.

(10) Patent No.: US 11,946,966 B1
(45) Date of Patent: Apr. 2, 2024

(54) SELECTIVE STATOR GROUND FAULT PROTECTION USING POSITIVE-SEQUENCE VOLTAGE REFERENCE

(71) Applicant: Schweitzer Engineering Laboratories, Inc., Pullman, WA (US)

(72) Inventors: Ritwik Chowdhury, Charlotte, NC (US); Jason Andrew Young, Smith Falls (CA); Jon Steinmetz, Hurricane, WV (US); Rogerio Scharlach, Sandy Springs, GA (US); Satish Samineni, Malvern, PA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 18/171,475

(22) Filed: Feb. 20, 2023

(51) Int. Cl.
G01R 31/08 (2020.01)
G01R 31/52 (2020.01)

(52) U.S. Cl.
CPC ......... *G01R 31/086* (2013.01); *G01R 31/088* (2013.01); *G01R 31/52* (2020.01)

(58) Field of Classification Search
USPC ........................................................ 324/522
See application file for complete search history.

(56) References Cited

U.S. PATENT DOCUMENTS

| | | | |
|---|---|---|---|
| 2,881,319 A | 4/1959 | Sills | |
| 3,727,123 A | 4/1973 | Smith | |
| 3,973,171 A | 8/1976 | Howell | |
| 4,000,464 A | 12/1976 | Nussel | |
| 4,001,646 A | 1/1977 | Howell | |
| 4,029,951 A | 6/1977 | Berry | |
| 4,066,950 A | 1/1978 | Rumold | |

(Continued)

FOREIGN PATENT DOCUMENTS

| | | |
|---|---|---|
| CN | 203324449 U | 12/2013 |
| JP | 53107640 | 9/1978 |

(Continued)

OTHER PUBLICATIONS

Dale Finney and Gerald Johnson, Loss of Prime Mover (Antimotoring) Protection, IEEE Tutorial on the Protection of Synchronous Generators, Special Publication of the IEEE Power System Relaying Committee, Second Ed., Chapter 3, Section 5, 2011.

(Continued)

*Primary Examiner* — Farhana A Hoque
(74) *Attorney, Agent, or Firm* — Jared L. Cherry

(57) ABSTRACT

Disclosed are systems and methods to determine a direction to a ground fault of an electrical generator or motor using a known steady-state standing error referenced to a positive-sequence voltage measurement to determine a system standing error and utilizing the system standing error to determine an operating current with anomalies attributable to a fault. A ground fault may be determined using zero-sequence voltage signals from the generator or motor installation. The operating current, along with the zero-sequence voltage, may be used to determine a direction to the fault. The generator or motor may be high-impedance grounded. The systems and methods further indicate the direction to a fault where multiple generators or motors are connected to a common bus.

20 Claims, 10 Drawing Sheets

(56) References Cited

U.S. PATENT DOCUMENTS

| | | |
|---|---|---|
| 4,088,935 A | 5/1978 | D'Atre |
| 4,148,087 A | 4/1979 | Phadke |
| 4,156,186 A | 5/1979 | Wolfinger |
| 4,159,499 A | 6/1979 | Breskin |
| 4,161,011 A | 7/1979 | Wilkinson |
| 4,206,398 A | 6/1980 | Janning |
| 4,245,182 A | 1/1981 | Aotsu |
| 4,321,643 A | 3/1982 | Vernier |
| 4,371,832 A | 2/1983 | Wilson |
| 4,511,811 A | 4/1985 | Gupta |
| 4,542,468 A | 9/1985 | Taniguti |
| 4,556,946 A | 12/1985 | Taniguti |
| 4,558,309 A | 12/1985 | Antonevich |
| 4,667,263 A | 5/1987 | Morris |
| 4,763,057 A | 8/1988 | Danz |
| 4,820,991 A | 4/1989 | Clark |
| 4,825,327 A | 4/1989 | Alexander |
| 4,851,758 A | 7/1989 | Ostada |
| 4,939,506 A | 7/1990 | Gram |
| 4,982,147 A | 1/1991 | Lauw |
| 5,057,962 A | 10/1991 | Alley |
| 5,252,915 A | 10/1993 | Sedding |
| 5,264,778 A | 11/1993 | Kimmel |
| 5,363,047 A | 11/1994 | Dresti |
| 5,365,396 A | 11/1994 | Roberts |
| 5,471,880 A | 12/1995 | Lang |
| 5,508,620 A | 4/1996 | Pfiffner |
| 5,514,963 A | 5/1996 | Korbmacher |
| 5,519,300 A | 5/1996 | Leon |
| 5,581,470 A | 12/1996 | Pawloski |
| 5,592,393 A | 1/1997 | Yalla |
| 5,633,550 A | 5/1997 | Meehan |
| 5,675,465 A | 10/1997 | Tanaka |
| 5,739,693 A | 4/1998 | Pfiffner |
| 5,764,462 A | 6/1998 | Tanaka |
| 5,805,395 A | 9/1998 | Hu |
| 5,933,306 A | 8/1999 | Santos |
| 5,963,404 A | 10/1999 | Guzman-Casillas |
| 5,982,595 A | 11/1999 | Pozzuoli |
| 6,121,886 A | 9/2000 | Anderson |
| 6,137,187 A | 10/2000 | Mikhail |
| 6,169,489 B1 | 1/2001 | Kliman |
| 6,262,550 B1 | 7/2001 | Kliman |
| 6,294,898 B2 | 9/2001 | Lawson |
| 6,308,140 B1 | 10/2001 | Dowling |
| 6,396,284 B1 | 5/2002 | Tisdale |
| 6,426,632 B1 | 7/2002 | Clunn |
| 6,459,269 B1 | 10/2002 | Jones |
| 6,492,801 B1 | 12/2002 | Sims |
| 6,496,757 B1 | 12/2002 | Flueck |
| 6,525,504 B1 | 2/2003 | Nygren |
| 6,573,726 B1 | 6/2003 | Roberts |
| 6,714,020 B2 | 3/2004 | Hobelsberger |
| 6,718,271 B1 | 4/2004 | Tobin |
| 6,721,671 B2 | 4/2004 | Roberts |
| 6,794,879 B2 | 9/2004 | Lawson |
| 6,794,883 B2 | 9/2004 | Klingel |
| 6,815,932 B2 | 11/2004 | Wall |
| 6,839,207 B2 | 1/2005 | Falliot |
| 6,924,565 B2 | 8/2005 | Wilkins |
| 6,924,628 B2 | 8/2005 | Thompson |
| 6,975,946 B2 | 12/2005 | Al-Hamrani |
| 6,992,490 B2 | 1/2006 | Nomoto |
| 7,006,935 B2 | 2/2006 | Seki |
| 7,253,634 B1 | 8/2007 | Kasztenny |
| 7,304,403 B2 | 12/2007 | Xu |
| 7,498,818 B2 | 3/2009 | Benmouyal |
| 7,528,611 B2 | 5/2009 | Kasztenny |
| 7,532,010 B2 | 5/2009 | Kamel |
| 7,592,772 B2 | 9/2009 | Nandi |
| 7,652,859 B2 | 1/2010 | Finney |
| 7,693,607 B2 | 4/2010 | Kasztenny |
| 7,710,693 B2 | 5/2010 | Guzman-Casillas |
| 7,804,303 B2 | 9/2010 | Benmouyal |
| 8,405,940 B2 | 3/2013 | Schweitzer |
| 8,942,954 B2 | 1/2015 | Gong |
| 9,007,731 B2 | 4/2015 | Finney |
| 9,496,707 B2 | 11/2016 | Thompson |
| 10,333,291 B2 | 6/2019 | Chowdhury |
| 10,797,632 B2 | 10/2020 | Chowdhury |
| 2001/0001534 A1 | 5/2001 | Lawson |
| 2002/0128759 A1 | 9/2002 | Sodoski |
| 2002/0140433 A1 | 10/2002 | Lawson |
| 2003/0085715 A1 | 5/2003 | Lubkeman |
| 2005/0033481 A1 | 2/2005 | Budhraja |
| 2006/0125486 A1 | 6/2006 | Premerlani |
| 2007/0085549 A1 | 4/2007 | Fischer |
| 2008/0074810 A1 | 3/2008 | Guzman-Casillas |
| 2009/0039655 A1 | 2/2009 | Berchowitz |
| 2009/0160454 A1 | 6/2009 | Johansson |
| 2009/0219030 A1 | 9/2009 | Salem |
| 2009/0254297 A1 | 10/2009 | Bengtsson |
| 2010/0126674 A1 | 5/2010 | Lin |
| 2010/0194324 A1 | 8/2010 | Kasztenny |
| 2011/0085272 A1 | 4/2011 | Schweitzer |
| 2011/0158786 A1 | 6/2011 | Molitor |
| 2012/0112758 A1 | 5/2012 | Weems |
| 2012/0123708 A1 | 5/2012 | Dong |
| 2012/0265457 A1 | 10/2012 | Donolo |
| 2013/0300209 A1 | 11/2013 | Long |
| 2015/0051852 A1 | 2/2015 | Pan |
| 2015/0222122 A1 | 8/2015 | Nuqui |
| 2016/0025811 A1 | 1/2016 | Kasztenny |
| 2016/0049891 A1 | 2/2016 | Frampton |
| 2016/0181790 A1 | 6/2016 | Thompson |
| 2018/0210060 A1* | 7/2018 | Guzman-Casillas ... G01R 35/00 |
| 2019/0072603 A1 | 3/2019 | Liu |
| 2019/0097418 A1 | 3/2019 | Chowdhury |
| 2020/0067445 A1 | 2/2020 | Chowdhury |

FOREIGN PATENT DOCUMENTS

| | | |
|---|---|---|
| JP | 56002569 | 1/1981 |
| JP | 3212117 | 9/1991 |
| JP | 7177646 | 7/1995 |
| JP | 11133093 | 5/1999 |
| JP | 2000333359 | 11/2000 |
| WO | 0239642 | 5/2002 |
| WO | 2014067742 | 5/2014 |

OTHER PUBLICATIONS

IEEE Guide for AC Generator Protection, IEEE Std C37. 102-1006, 2007.

Rik Pintelon, Johan Schoukens, System Identification: A Frequency Domain, Section 4.3 (pp. 119-131), Jan. 1, 2001.

Beckwith Electric Co., Inc., M-3425A Generator Protection flyer, 2001.

Siemens AG, Numerical Machine Protection Manual, Published 1996.

ABB, Type DGF Generator Field Relay, ABB Automation, Inc. Feb. 1977.

J.Lewis Blackburn, Protective Relaying Principles and Applications, Chapter 8: Generator Protection, pp. 262-267, 1997.

TYCO Electronics Energy Division, Installation and Operating Instructions R.O.C.O.F. Protection Relay, Nov. 2002.

Michael Simpson and John Merrell, Low-Sequence Impedances on Generators, Aug. 30, 2000.

Mu Longhua and Li Ziaono, Selective Ground-fault Protection Using an Adaptive Algorithm Model in Neutral Ungrounded Power Systems, IEEE International Conference on Power System Technology, Dec. 2000.

Benmouyal, G. "The Impact of Synchronous Generators Excitation Supply on Protection Relays". Schweitzer Engineering Laboratories, Inc. Oct. 29, 2007.

Schweitzer Engineering Laboratories, Inc., SEL-300G Generator Relay flyer, Jun. 22, 2007.

Klingerman, Nathan, et al., "Understanding Generator Stator Ground Faults and Their Protection Schemes", Presented at the 42nd Annual Western Protective Relay Conference, Oct. 2015.

(56) References Cited

OTHER PUBLICATIONS

Beckwith Electric Co., Inc., Application Note #27, "Beckwith Electric M-3425A Generator Protection Relay Setting Clarification 27TN Third Harmonic Undervoltage Element", Dec. 13, 2004.
Siemens, Siprotec 5 Generator Protection 7UM85 Manual, Sections 6.7-6.9, Nov. 2015.
Beckwith Electric Co., Inc., M-3425A Generator Protection Instruction Book, 2004.
R. Chowdhury, D. Finney, N. Fischer, J. Young, V. Skendzic, and S. Patel, "Stator Ground Protection for Multiple High-Impedance Grounded Generators Sharing a Bus," proceedings of the 45th Annual Western Protective Relay Conference, Oct. 2018.

* cited by examiner

SELECTIVE STATOR GROUND FAULT PROTECTION USING POSITIVE-SEQUENCE VOLTAGE REFERENCE

TECHNICAL FIELD

This disclosure relates to techniques that may be utilized to detect stator ground faults in high-impedance grounded, and/or ungrounded, electric power generators or motors connected to a common bus with another high-impedance grounded and/or ungrounded electric power generator. More particularly, but not exclusively, the present disclosure is applicable to providing selective ground fault protection to a generator or motor connected to a common bus with at least one additional generator or motor by using a positive-sequence voltage measurement and a fixed standing error reference to evaluate a current measurement.

BRIEF DESCRIPTION OF THE DRAWINGS

Non-limiting and non-exhaustive embodiments of the disclosure are described, including various embodiments of the disclosure with reference to the figures, in which.

Figure 1:
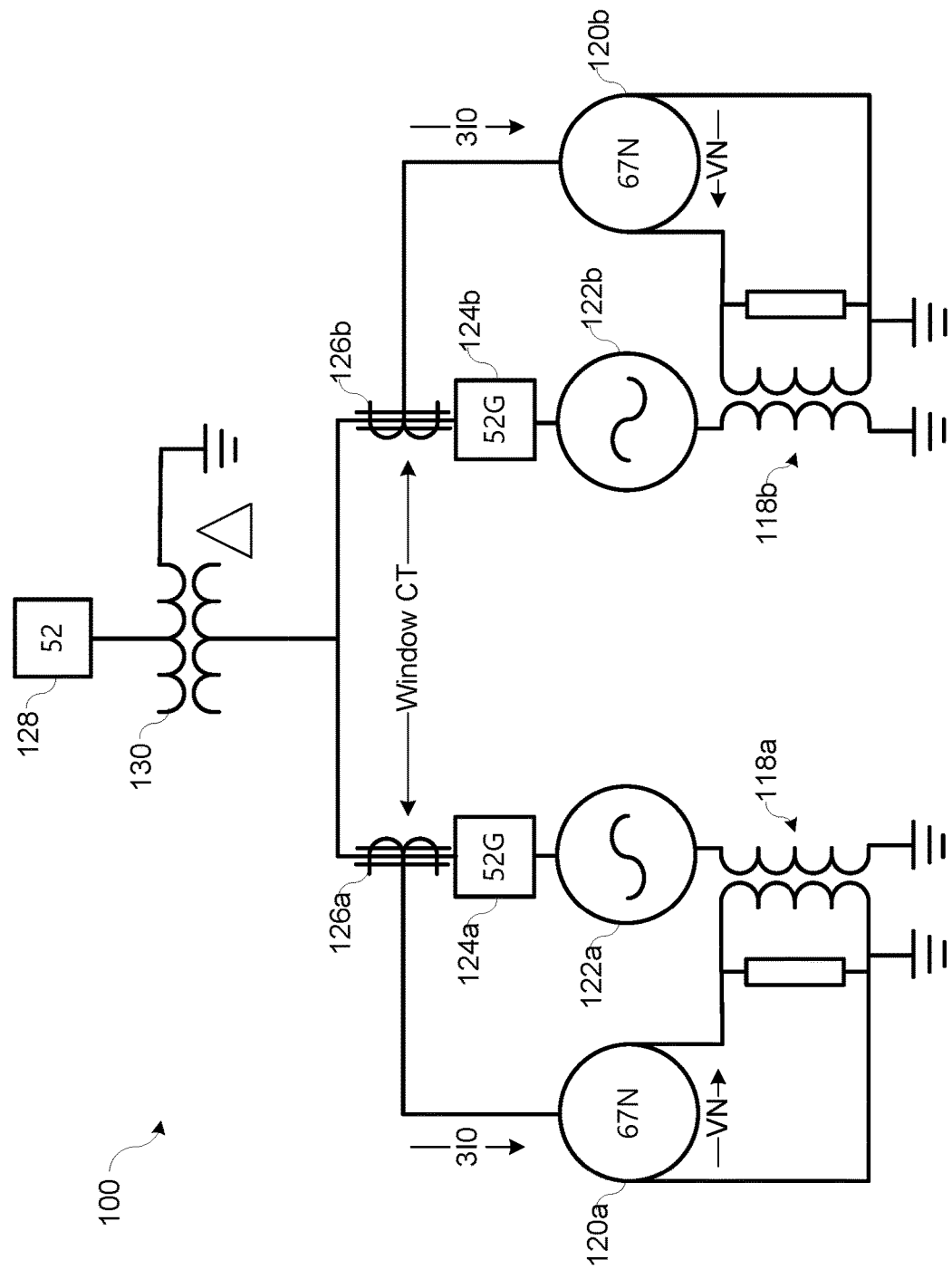
FIG. 1 illustrates a one-line diagram of a system including a window current transformer (CT) that may provide currents for a directional element consistent with embodiments of the present disclosure.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Electric power delivery systems include varied equipment used to maintain the reliability of electric power generation, transmission, and distribution. Generators play the important role of generating the electric power that is transmitted, distributed, and consumed using the electric power delivery system. Generators may be embodied in many different forms and may be in electrical connection with the electric power delivery system in different ways and may even be grounded in different ways. Many generators include a prime mover which rotates a rotor near a stator such that a voltage is induced in the windings of the stator by the rotation of the rotor. Generators may be multi-phase, with many generators in modern electric power delivery systems providing three phases of power.

Generators may be connected to ground in various ways. In certain implementations, generators are connected to ground by high impedance through a neutral point. A neutral grounding resistor across the neutral grounding transformer may then be used to obtain electrical signals used in protection of the generator. However, proper protection of high-impedance grounding of a generator requires that ground faults in the generator be detected so that the generator may be disconnected to protect it from further damage due to the ground fault.

Previous attempts to selectively detect ground faults in a high-impedance grounded generator have not been sufficiently dependable. For example, in one solution, a current signal is obtained using current transformers (CTs) in connection with the generator. However, the solution using only currents resulted in diminished sensitivity in certain applications. Hence, such solutions lack dependability. What is needed is a system for providing sensitive ground fault direction in a generator with high-impedance grounding. Disclosed herein are improvements to existing ground fault detection technology. The specific improvements include calculating a ground fault direction using current measurements and using a fixed steady-state reference value. For example, a positive-sequence voltage measurement and a standing error reference may be utilized.

In operation, a positive-sequence voltage measurement may be a reliable system voltage measurement because there is no significant change to the measured positive-sequence voltage in response to a ground fault. The positive-sequence voltage measurement during a ground fault may be substantially the same as the positive-sequence voltage measurement prior to the ground fault (e.g., in a steady-state condition). Additionally, a predetermined and known standing error may exist in the system during normal steady-state conditions and during ground fault conditions.

Accordingly, a predetermined and known standing error may be stored permanently and utilized during ground-fault monitoring. The scale of the standing error may be adjusted during system monitoring to determine the present standing error of the system by referencing the present positive-sequence voltage and adjusting the known standing error value accordingly. With the adjusted standing state error value, the present steady state error may be subtracted from the measured current to provide a current signal that may be utilized to effectively determine the ground fault conditions.

Systems and methods consistent with the present disclosure may monitor the electrical parameters associated with electric power system generators with high-impedance grounding, to detect a direction of a ground fault in the generator. In certain embodiments, ground fault direction is calculated using a known positive-sequence voltage reference and/or a known standing error reference for improved sensitivity of ground fault direction determination in the high-impedance generator. This improves the functioning of the generator and the functioning of a device configured to monitor the generator by providing an indication as to whether the ground fault is internal to the protected generator or external thereto. Knowledge of the fault being external would save significant cost as it removes the need to test the stator winding. Furthermore, the embodiments herein improve the functioning of the generator and the functioning of a device configured to monitor the generator in that when multiple high-impedance grounded generators share a common bus, it allows selective unit tripping.

Although the present application provides several specific examples related to generators, one of skill in the art will recognize that the teachings of the present disclosure may also be applied to motors.

Reference throughout this specification to "one embodiment" or "an embodiment" indicates that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. In particular, an "embodiment" may be a system, an article of manufacture (such as a computer readable storage medium), a method, and/or a product of a process.

The phrases "connected to," "networked," and "in communication with" refer to any form of interaction between two or more entities, including mechanical, electrical, magnetic, and electromagnetic interaction. Two components may be connected to each other, even though they are not in direct physical contact with each other and even though there may be intermediary devices between the two components.

Some of the infrastructure that can be used with embodiments disclosed herein are already available, such as: general-purpose computers, computer programming tools and techniques, digital storage media, and optical networks. A computer may include a processor such as a microprocessor, microcontroller, logic circuitry, or the like. The processor may include a special purpose processing device such as an ASIC, PAL, PLA, PLD, Field Programmable Gate Array, or other customized or programmable device. The computer may also include a computer readable storage device such as: non-volatile memory, static RAM, dynamic RAM, ROM, CD-ROM, disk, tape, magnetic, optical, flash memory, or other computer readable storage medium.

The described features, operations, or characteristics may be combined in any suitable manner in one or more embodiments. It will also be readily understood that the order of the steps or actions of the methods described in connection with the embodiments disclosed herein may be changed, as would be apparent to those skilled in the art. Thus, any order in the drawings or detailed description is for illustrative purposes only and is not meant to imply a required order, unless specified to require an order.

In the following description, numerous details are provided to give a thorough understanding of various embodiments. One skilled in the relevant art will recognize, however, that the embodiments disclosed herein can be practiced without one or more of the specific details, or with other methods, components, materials, etc. In other instances, well-known structures, materials, or operations are not shown or described in detail to avoid obscuring aspects of this disclosure.

FIG. 1 illustrates a one-line diagram of a system 100 including a window CT that may act as a directional element consistent with embodiments of the present disclosure. Two generators 122a, 122b are shown in the illustrated embodiment. Additional generators may be connected in similar manner in other embodiments. Each generator 122a, 122b has a high-impedance ground circuit 118a, 118b, respectively. Each generator 122a, 122b may be selectively connected or disconnected using circuit breakers 124a, 124b, respectively. Various elements in system 116 are identified using the ANSI standard device numbers. Each generator unit may be monitored by a neutral directional overcurrent relay 120a, 120b, respectively. Generators 122a, 122b may connect to a generator step-up (GSU) transformer 130, which may be connected to the electric power system through a breaker 128.

The illustrated embodiment is representative of many installations in which generator units have individual high-impedance ground connections and share a generator step-up (GSU) transformer. Such configurations are particularly common in hydroelectric generation facilities. Practical and economic factors contribute to the commonality of multiple generator units coupling to a shared GSU transformer. As discussed above, however, this configuration may make it difficult to identify a ground fault in one of the generator units. The high-impedance ground circuits 118a, 118b result in negligible fault currents.

The negligible fault currents resulting from a ground fault can make it difficult to determine which generator unit is faulted. One solution is to provide a window CT 126a, 126b for each generator unit. CTs 126a, 126b may be core-balance current transformers that each measure the sum of currents through all three phases. In typical operation, the sum of the current through the three phases is zero; however, a fault in the system can cause this measured current to increase and be detected. Such a system provides a sensitive directional measurement to relays 120a, 120b.

In practice, it is difficult in many applications to run conductors carrying all three phases through a window CT. For example, physical constraints of the facility may preclude such a configuration, or such a configuration may be cost-prohibitive. In cases where it is either not feasible or not economical to run the conductors through a window CT, each phase may be monitored by a separate CT. CTs measuring each of the three phase currents is available in most applications. Using three separate CTs to measure each phase, however, creates a standing error. The standing error may be relatively large in comparison to a current created by a high-impedance ground fault. As such, the difficulty in determining directionality remains.

The inventors of the present disclosure have recognized that these and other issues may be addressed by relying on the invariance of the positive-sequence voltage during a ground fault.

Figure 2A:
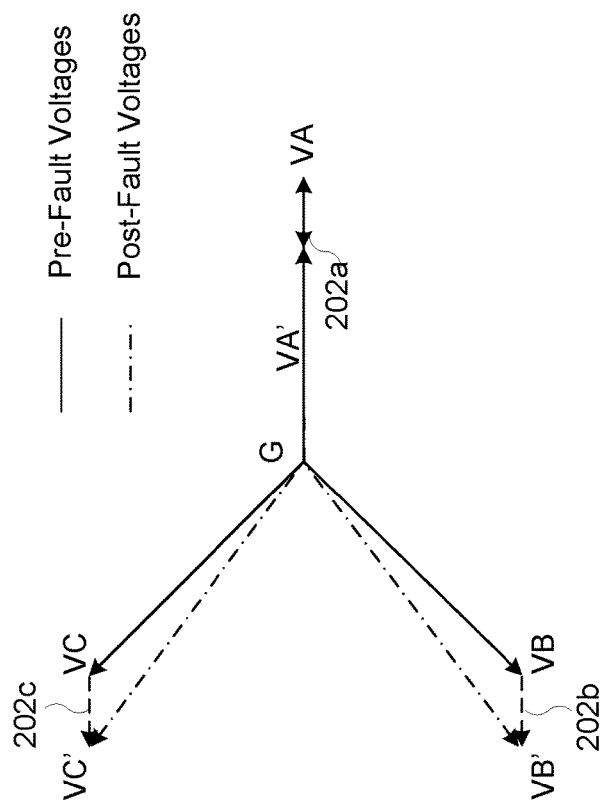
FIG. 2A illustrates a phasor diagram showing the three phase voltages before and after a fault consistent with embodiments of the present disclosure.

FIG. 2A illustrates a phasor diagram showing three phases before and after a fault consist with embodiments of the present disclosure. The voltages before the fault are shown using solid lines, while the post-fault voltages are shown using lines with a dash-dot pattern. The change 202a, 202b, and 202c from the pre-fault value to the post-fault value is represented by dashed line. In a positive-sequence voltage transformation, the post-fault voltage value is unchanged from the pre-fault voltage value. Given that the positive-sequence voltage remains unchanged as a result of a ground fault, this value may be used as a reference quantity.

Figure 2B:
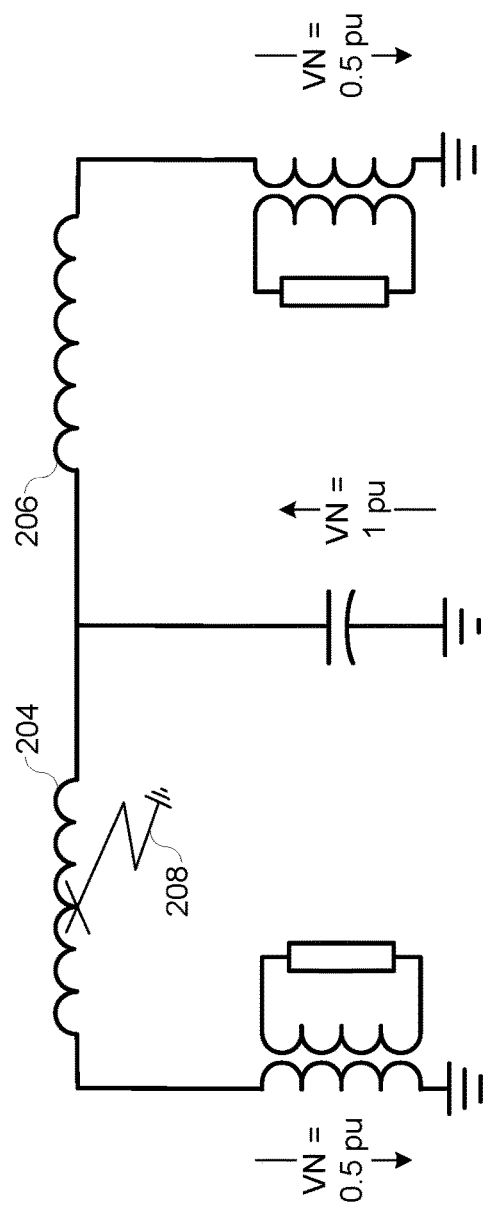
FIG. 2B illustrates a one-line diagram showing a fault associated with a generator consistent with embodiments of the present disclosure.

FIG. 2B illustrates a one-line diagram showing a fault 208 associated with a generator 204 consistent with the present disclosure. The change in voltage as a result of fault 208 is evenly distributed between a branch of a circuit associated with the fault 208 and an un-faulted branch associated with generator 206. As a result of the fault, the neutral voltage becomes 0.5 per unit for each branch of the circuit, and the positive-sequence voltage at the terminal remains unchanged.

A pre-fault steady-state standing error reference may be determined by the system when it is known that the generator system is operating in pre-fault steady-state condition, prior to the ground fault that causes an increase in the neutral voltage. This pre-fault steady-state standing error reference may then be stored in a memory of the system and will not change during ground fault monitoring by the system. Accordingly, the same pre-fault steady-state standing error reference may be utilized with a measured positive-sequence voltage and a measured current to determine the generator operating conditions and to detect ground faults.

Using a positive-sequence voltage measurement and a pre-fault steady-state standing error reference may have many advantages over utilizing prior measured current values that are measured and recorded incrementally during ground fault monitoring. For example, using a stored fixed reference that may be adjusted using the measured positive-sequence voltage eliminates the need to record past time-varying current values during operation for comparison to recent measured values, thus reducing computing and memory resources.

Furthermore, using a present positive-sequence voltage measurement to adjust the known steady-state error makes the reference used for current calculations more reliable, because a past current measurement taken incrementally during ground fault monitoring may include a fault error and may not correspond to steady-state system properties making any calculations used with such prior measured values under the assumption that they correspond to the steady-state value inaccurate and unreliable.

Additionally, using a present positive-sequence voltage measurement to adjust the known steady-state error may provide more reliable calculations that require less computational resources to calculate. For example, such calculations may require less computational resources to account for variations in system operating frequency over time. It may be desirable to operate a generator system at a fixed operating frequency (e.g., it may be desirable to operate the generation system at 60 cycles per second (60 Hz)). It is not always possible, however, to maintain a perfect, fixed operating frequency. Accordingly, it may be more reliable to utilize a known fixed reference with a present positive-sequence voltage measurement that is at the present frequency and phase to compare to a present measured current to accurately determine system operating conditions, as compared to utilizing a past current measurement taken incrementally during ground fault monitoring, which may have a varying frequency and phase shift.

The system standing error ($Isens_{ERR}$), determined from the known steady-state standing error current with reference to the measured positive-sequence voltage, may be subtracted from the measured sensitive current ($Isens_M$) to provide a sensitive operating current ($Isens_{OP}$) for the generator system with the steady-state error removed, such that the anomalies in the sensitive operating current correspond only to the ground fault, according to the following Equation 1. Note that all the variables in Equation 1 are phasor quantities containing a real and imaginary part.

$$Isens_{OP} = Isens_M - Isens_{ERR} \qquad \text{Eq. 1}$$

where:

$Isens_{ERR}$ is the system standing error; it may be calculated when there is no ground fault detected (e.g., neutral voltage less than a threshold) by use of a low-pass filter that tracks the neutral current in reference to the positive-sequence voltage.

$Isens_m$ is the measured sensitive current; and $Isens_{REF}$ is the sensitive operating current.

The system standing error for the sensitive current the system standing error $Isens_{ERR}$ may be removed from a measured sensitive current $Isens_m$ resulting in a clean sensitive operating current $Isens_{REF}$ (e.g., a sensitive current measurement that excludes the system standing error). When the system standing error $Isens_{ERR}$ is removed from a measured sensitive current $Isens_m$ the resulting sensitive operating current $Isens_{REF}$ shows deviations from a theoretical normal. Thus, these deviations can be attributed to a generator system fault, rather than to the normal system standing error condition.

Once the sensitive operating current $Isens_{OP}$ is determined, the sensitive operating current $Isens_{OP}$ can be compared to the neutral voltage measurement and determine if it is leading or lagging and determine the directionality of the fault.

Figure 3:
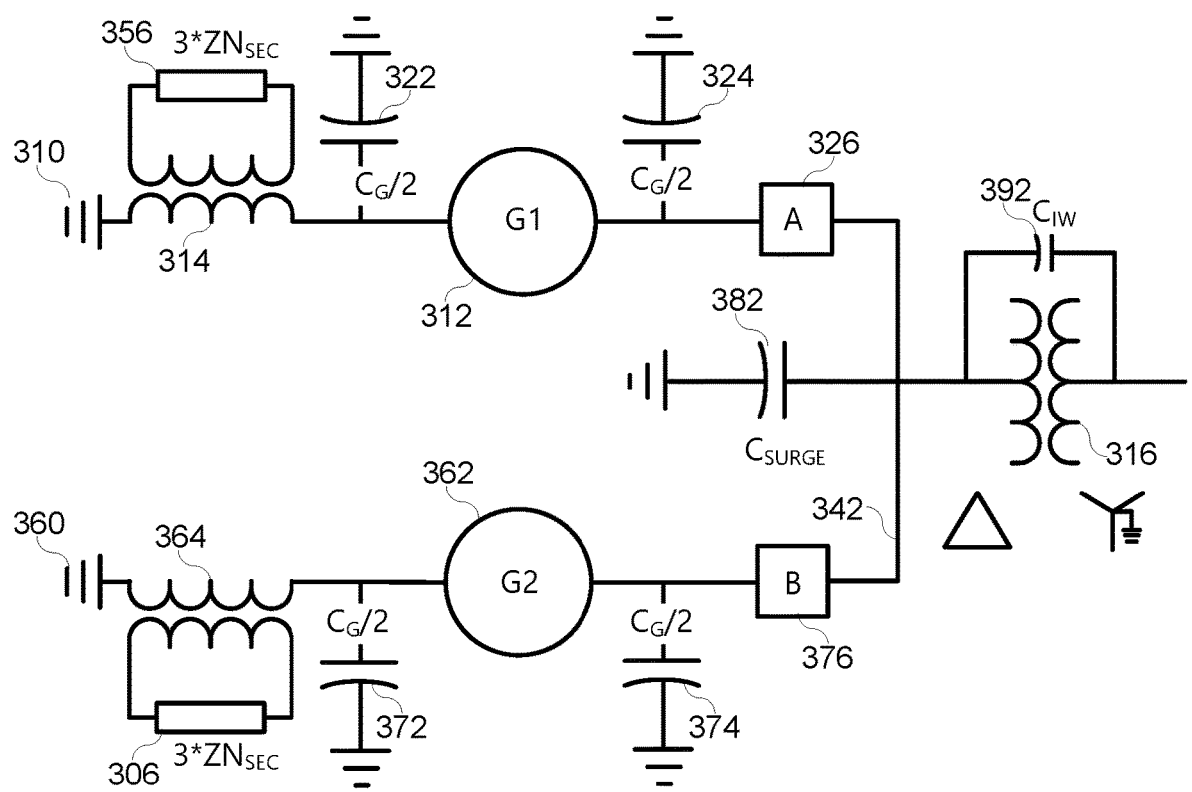
FIG. 3 illustrates a simplified one-line diagram of an electric power delivery system with high-impedance grounded generators that may be protected using the embodiments described herein.

FIG. 3 illustrates a simplified one-line diagram of an electric power generation system, including multiple generator units in connection with a common bus, that may benefit from the ground fault detection embodiments described herein. The system includes two generators 312 and 362 in connection with a common generation bus 342 for providing electric power to the electric power delivery system via a transformer 316. The generator 312 may be high-impedance grounded to a ground 310 using a high-impedance grounding transformer 314 that includes a grounding resistor 356. An insulation capacitance of a stator winding of the generator 312 is represented by capacitors 322 and 324. The generator 312 is in connection with the generation bus 342 via a circuit breaker 326. Similarly, the generator 362 is high-impedance grounded to the ground 360 using a high-impedance grounding transformer 364 that includes a grounding resistor 306. The insulation capacitance of the stator winding of the generator 362 is represented by capacitors 372 and 374. The generator 362 is in connection with the generation bus 342 via a circuit breaker 376. Surge capacitance installed between the generation bus 342 and ground 310, 360 is represented by a capacitor 382. Interwinding capacitance across the transformer 316 windings is represented by a capacitor 392. As has been suggested above, embodiments herein may be used to determine a ground fault in the generators 312, 362 that provide electric power to a common generation bus 342 and are high-impedance grounded. Indeed, the embodiments herein may be used to selectively determine which generator 312 or 362 has the ground fault.

Figure 4A:
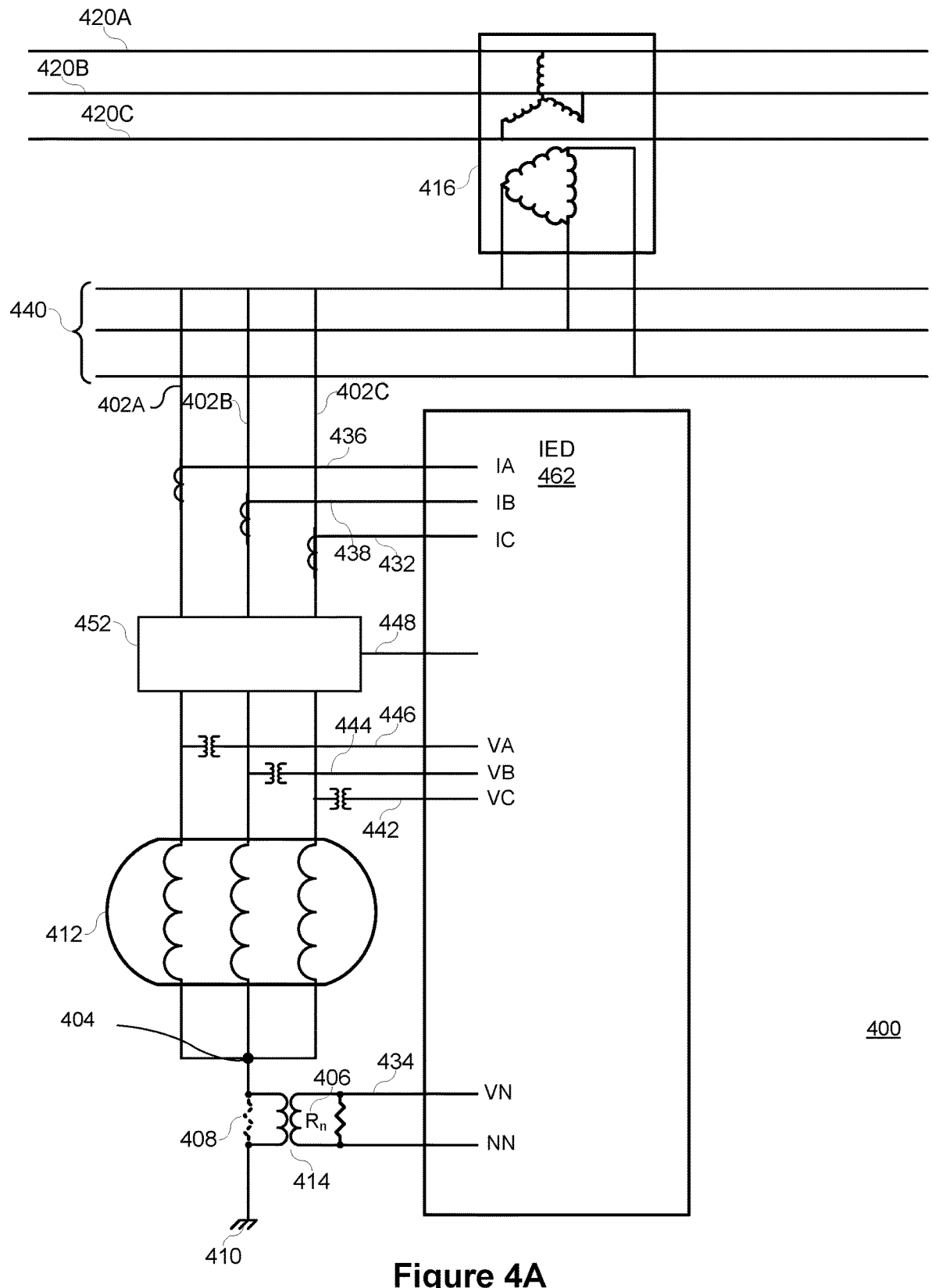
FIGS. 4A and 4B illustrate simplified diagrams of high-impedance grounded generators and devices for providing sensitive directional protection thereto according to several embodiments herein.

FIG. 4A illustrates a simplified diagram of a system 400 in accordance with several embodiments herein showing electrical connections for obtaining electrical measurements for selective directional protection in accordance with several embodiments herein. The system 400 includes a generator 412 in electrical connection with a generation bus 440, which provides electrical power to conductors 420A, 420B, and 420C via a transformer 416. The generator 412 may include three phase conductors 402A, 402B, and 402C in connection with the three phases of the generation bus 440 via a circuit breaker 452 (which may include a three-phase circuit breaker or three single-phase circuit breakers, or the like). There may be additional generators providing electrical power to the generation bus 440 as illustrated in FIG. 3, although only a single generator is illustrated for simplicity. The generator 412 and the system 400 may include three phases, A, B, and C. The generator 412 may include a rotor with three phases and a common neutral point 404 connected to ground 410 through a grounding resistor 408 and a high-impedance grounding transformer 414.

An IED 462 may be provided to obtain electrical signals from the system 400, determine conditions on the system 400, and provide protective operations to the system 400 upon detection of certain conditions. For example, the IED 462 may perform selective directional fault detection for the generator 412, thereby discriminating against a fault on bus 440 or other generators (not illustrated in this FIG. 4) connected to bus 440. The IED 462 may obtain voltage signals VA 446, VB 444, and VC 442 from the output of the generator 412 using potential transformers (PTs). Although illustrated as separate (typically connected wye-grounded) PTs, the voltage signals may be obtained using other configurations including, for example, broken-delta connected PTs. The IED 462 may obtain current signals IA 436, IB 438, and IC 432 from the stator of the generator 412 using current transformers (CTs). The IED 462 may further obtain a neutral voltage signal VN 434 from the grounding transformer 414. Furthermore, the IED 462 may send command signals 448 to the circuit breaker 452, such as a trip or open command, upon determination of an internal fault condition in the generator 412. The IED 462 may obtain further electrical signals from the generator 412, the generation bus 440, and other generators in connection with the generation bus 440.

Any terminal CTs that measure zero-sequence current and provide it to the IED 462 may be used for CT signals. In one embodiment, core-balanced windowed CTs may be used to measure the zero-sequence current using a primary current summation. In another embodiment, residually-connected phase CTs may be used to measure the zero-sequence current using a CT secondary current summation.

Figure 4B:
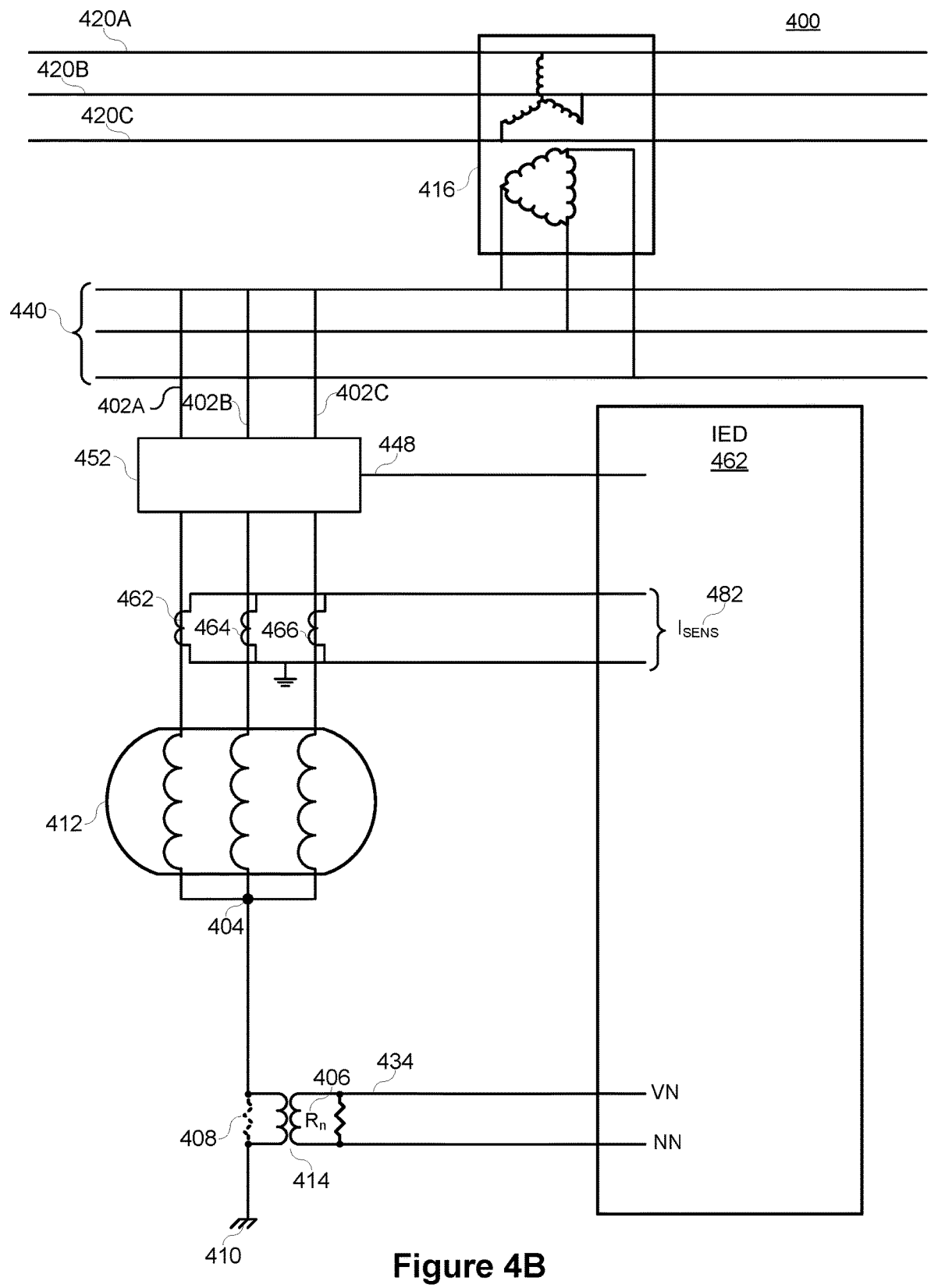

FIG. 4B illustrates a simplified diagram of system 400 of FIG. 4A, for obtaining sensitive current measurements in accordance with several embodiments herein. Instead of current inputs rated at 5A or 1A, the IED inputs for obtaining sensitive current measurements can be rated at around 0.2A. In various tests it has been observed that such inputs can detect 1 mA of current with an error of 2.5 percent. In certain embodiments herein, the sensitive current measurements may be used to determine a direction of a generator ground fault. It should also be noted that FIGS. 4A and 4B illustrate IEDs 462 capable of obtaining different signals from the electric power delivery system 400, and are not mutually exclusive. IEDs in accordance with various embodiments herein may obtain any combination of the signals as illustrated in FIG. 4A and FIG. 4B, or even all of the signals as illustrated in FIGS. 4A and 4B, and may even obtain additional signals not illustrated (for example, voltages from the generator bus 440, currents from the generator bus 440, voltages and/or currents from the lines 420A, 420B, 420C, generator temperature, and the like).

The IED 462 may obtain sensitive current $I_{SENS}$ 482 signals using CTs 462, 464, and 466 as illustrated. That is, the CTs 462, 464, and 466 may measure current through conductors 402A, 402B, and 402C from the generator 412 in a star configuration. Accordingly, the IED 462 may obtain the $I_{SENS}$ 482 signal.

Returning to FIG. 3, there are several configurations or conditions under which a sensitive directional protection element as described herein may be used to determine ground fault conditions in electrical generator(s). A first condition includes operation of both generators 312, 362 in parallel (e.g., the breakers 326, 376 are closed). A second condition includes operations of a single generator 312, 362 (e.g., the breaker 326 is open and the breaker 376 is closed; or the breaker 326 is closed and the breaker 376 is open). A third condition includes detection of a generator step-up (GSU) transformer ground fault on the high-voltage side that couples through the GSU inter-winding capacitance 392. A fourth condition includes detection of ground faults where both generators 312, 362 are high-impedance grounded via a Peterson coil.

According to several embodiments herein, the direction to a ground fault in a generator system such as those illustrated in FIGS. 3, 4A, and 4B may be determined using a positive-sequence voltage measurement and a predetermined steady-state (e.g., pre-fault) standing error. As different systems may have different CTs already installed for obtaining current signals, use of a positive-sequence voltage measurement and a predetermined steady-state standing error as described herein may improve the functioning of the IED because certain CT configurations result in substantial error in the current signal, which may lead to inaccurate directional determination. For example, residually connected phase CTs often have errors that are in the tens of mA, resulting in a steady-state standing error that could be larger than the ground fault current to be detected. As described below, the embodiments herein use a positive-sequence voltage measurement and a steady-state standing error reference that is predetermined and stored as a reference to determine a direction to the generator ground fault.

Figure 5A:
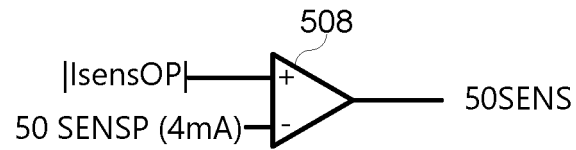
FIGS. 5A, 5B, and 5C illustrate simplified logic diagrams of sensitive directional protection for a high-impedance grounded generator in accordance with several embodiments herein.
Figure 5B:
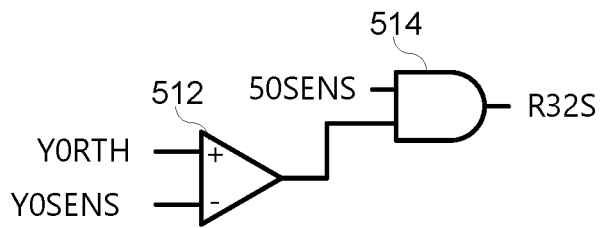
Figure 5C:
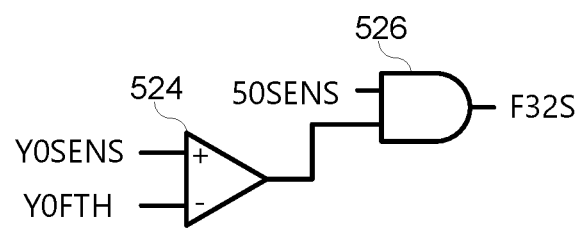

As illustrated in FIG. 5A, the directional logic of FIGS. 5B and 5C may be supervised by an overcurrent element comparing 508 a magnitude of a residual current $I_{SENSOP}$ to an overcurrent threshold such as 50 SENSP, which may be, for example, on the order of 4 mA. A sensitive current high signal 50SENS may be used to enable a sensitive directional fault logic in a reverse direction R32S, as illustrated in FIG. 5B, and used to enable the sensitive directional fault logic in the forward direction F32S as illustrated in FIG. 5C.

The sensitive directional fault in the reverse direction R32S may be determined as illustrated in FIG. 5B, when both: 1) the sensitive current high signal 50SENS is asserted; AND 514, 2) the sensitive admittance Y0SENS is below the reverse threshold Y0RTH in comparator 512. The sensitive directional fault in the forward direction F32S is determined as illustrated in FIG. 5C, when both: 1) the sensitive current high signal 50SENS is asserted; AND 526, 2) the sensitive admittance Y0SENS is exceeds the forward threshold Y0FTH in comparator 524.

The sensitive admittance Y0SENS may be calculated using Equation 2:

$$Y0SENS = \operatorname{Re}\left(\frac{DIsens \cdot e^{-j\frac{5\pi}{4}}}{3*(-V_N)}\right) * \frac{CTR}{PTRN} \qquad \text{Eq. 2}$$

where:
V_N is the neutral voltage;
CTR is the current transformer ratio; and,
PTRN is the potential transformer ratio of the neutral potential transformer.

Furthermore, the thresholds for forward and reverse admittance may be determined as a product of a primary admittance and a factor using, for example, Equations 3 and 4:

$$Y0FTH = +0.1 \text{ mS primary} \quad \text{Eq. 3}$$

$$Y0RTH = -0.1 \text{ mS primary} \quad \text{Eq. 4}$$

It should be noted that the ±0.1 mS admittance thresholds may be obtained by taking the inverse of a 10 kΩ $Z_0$ impedance threshold (where $Z_0$ is a zero-sequence impedance). Generally, $Z_0$ for high-resistance grounded systems is less than 5 kΩ. Using a 10 kΩ threshold provides adequate margin.

Furthermore, the logic described herein may be used in conjunction with high-resistance (HiR) grounded generators for certain applications. The embodiments herein may be used in a HiR grounded generator to provide selectivity for a forward fault in a unit-connected case where it is possible that sufficient current is not seen by the sensitive current input compared to a reverse fault on the bus. This is dependent on the surge capacitor size. If there are multiple generators connected to the same GSU winding, then there are additional zero-sequence paths presented by the unfaulted generator stator-ground capacitances and grounding resistances.

The embodiments herein may be used in a HiR grounded generator to determine a reverse fault in the generator zone (iso-phase bus for example), wherein the protected unit will typically source a higher amount of zero-sequence current due to the neutral grounding resistor (NGR) and the stator winding capacitance.

The embodiments herein may determine sensitive directional faults where generators are connected that are high-impedance grounded where a small amount of capacitive charging current and high-impedance ground current is available.

The embodiments herein may be applied to resonant-grounded generators (HiL). In certain generator installations, it is possible that sufficient current will not be seen by the sensitive current input. In such installations, no forward or reverse declaration is provided if there is no measurable current. For example, in the case of a reverse fault in the generator zone, the resonant grounded generator will provide negligible current (as is the objective of resonant grounding). Forward faults may still be detected if the surge capacitor sources sufficient zero-sequence current.

Figure 6:
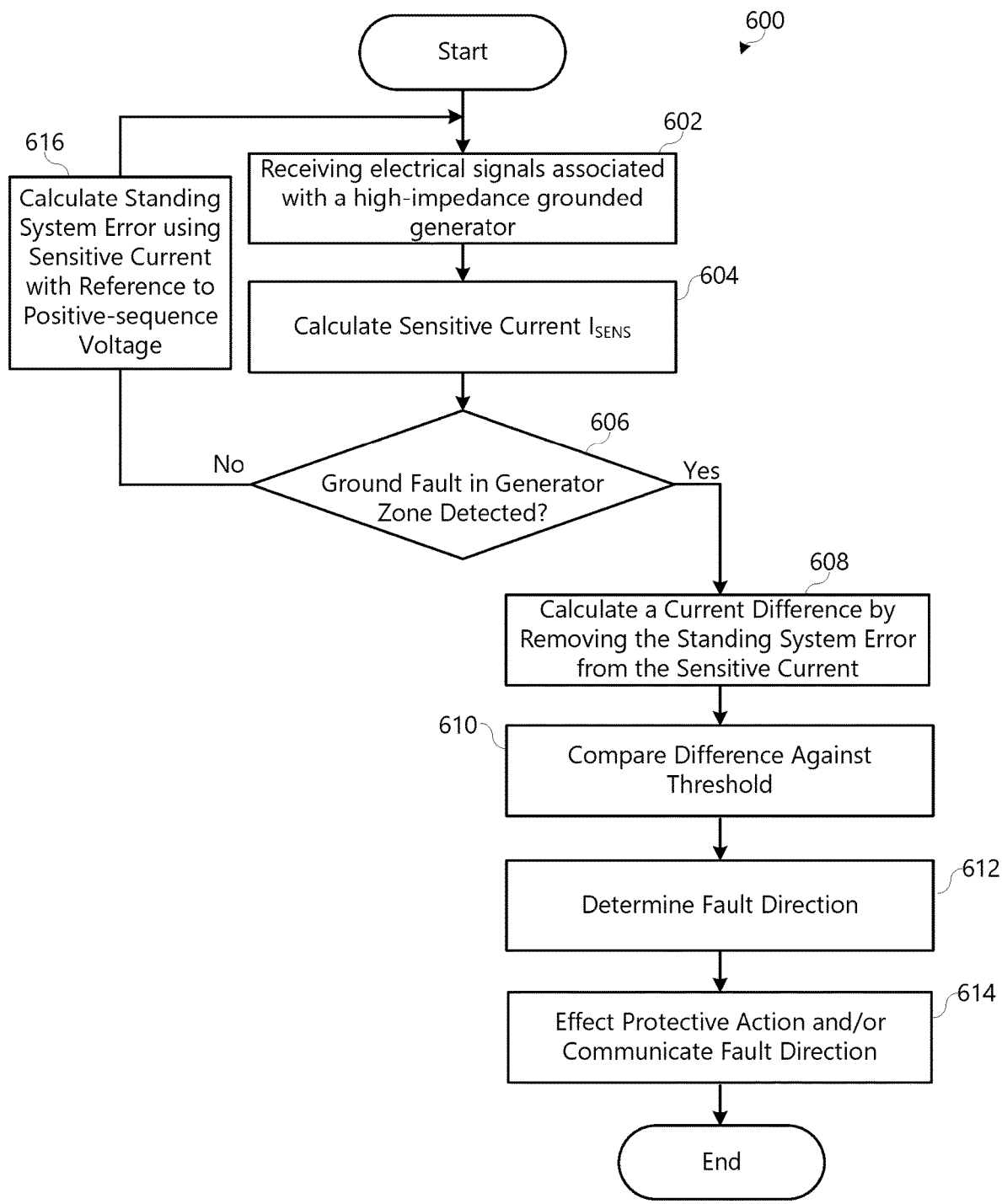
FIG. 6 illustrates a flow diagram of a method for providing sensitive directional protection for a high-impedance grounded generator in accordance with several embodiments herein.

FIG. 6 illustrates a flow diagram of a method for providing sensitive directional protection for a high-impedance grounded generator in accordance with several embodiments herein. The method 600 starts with receiving electrical signals associated with a high-impedance grounded generator 602. The electrical signals may include voltages, currents, sensitive current, and the like as discussed herein. The method 600 may calculate sensitive current $I_{SENS}$ from the signals 604. From the received signals, the method may determine whether a ground fault within the generator zone of protection is detected at 606. Detection of an in-zone generator ground fault may be determined when an absolute value of voltage in the neutral $|V_N|$ exceeds a predetermined ratio such as, for example, 5% of the high-neutral voltage setting VNHI and there is no detection of an out-of-zone condition. If such a ground fault is not detected, the method returns to receiving signals at 602.

If no ground fault is detected at 616, then the method 600 uses the measured sensitive current $Isens_m$ with reference to the positive-sequence voltage to calculate a standing error current $Isens_{ERR}$. This standing error current $Isens_{ERR}$ may be tracked using a low-pass filter. As described herein, there may be other checks when determining $Isens_{ERR}$ such as there is sufficient positive-sequence voltage and not too much neutral voltage, and other checks as described herein.

If such a ground fault is detected at 606, then the method 600 uses the measured sensitive current $Isens_m$ and the system standing error $Isens_{ERR}$ to calculate the operating current $Isens_{OP}$ at 608. The method 600 may compare the calculated operating current $Isens_{OP}$ against a threshold at 610. For example, the method 600 may compare a magnitude of $Isens_{OP}$ against a predetermined or set threshold such as 60SENSP, which may be on the order of 4 mA as shown in FIG. 5A.

If the difference exceeds the threshold, then the method 600 may continue to determine the fault direction at 612. The direction to the fault may be determined by comparing the sensitive admittance Y0SENS against a forward sensitive admittance threshold Y0FTH and against a reverse sensitive admittance threshold Y0RTH such as is illustrated in FIGS. 5B and 5C. The forward and reverse determination may include a determination of whether the other of the forward and reverse direction determination has asserted. For example, the forward direction determination may be asserted only if the sensitive admittance Y0SENS exceeds the forward sensitive admittance threshold Y0FTH and the reverse direction R32S has not asserted.

When the method 600 determines a direction to the fault at 612, the method 600 may affect a protective action and/or communicate the fault direction at 614. For a forward fault determination, the method may affect a protective action on the generator such as, for example, operating a circuit breaker to disconnect the generator from the electric power delivery system. As described herein, a forward fault may signify that the fault is internal to the generator (a ground fault on the stator windings). Other protective actions may be taken such as, for example, asserting a communication that the fault is internal. In certain embodiments, further checks may be made before effecting the protective action such as, for example, determining that a reverse fault has not been asserted; determining that a different generator is not also faulted, and the like.

When the method 600 determines a reverse fault at 612, the method 600 may assert a communication that a reverse fault has been determined at 614. The asserted communication may be a communication to a supervisory system such that a user may know that the fault is external to the generator, and further study of the windings of the generator is not necessary.

Furthermore, the method 600 may determine that the direction to the fault is unknown. That is, the protective device may be configured to allow other protective elements to assert if the direction to the fault using the residual current is not sufficient to determine a fault direction. For example, if both the forward and reverse fault determinations are asserted, then the direction to the fault is unknown, and an action is not taken.

In several embodiments, the method 600 may communicate the fault direction in any case. That is, if any of the forward, reverse, or uncertain fault direction is determined at 612, the direction is communicated at 614. Upon communications of the fault direction, a separate system that considers the fault direction determined by different devices implementing method 600 may then determine the sequence used to trip the different generators and issue a trip based on the determined sequence. The method may then end.

Figure 7:
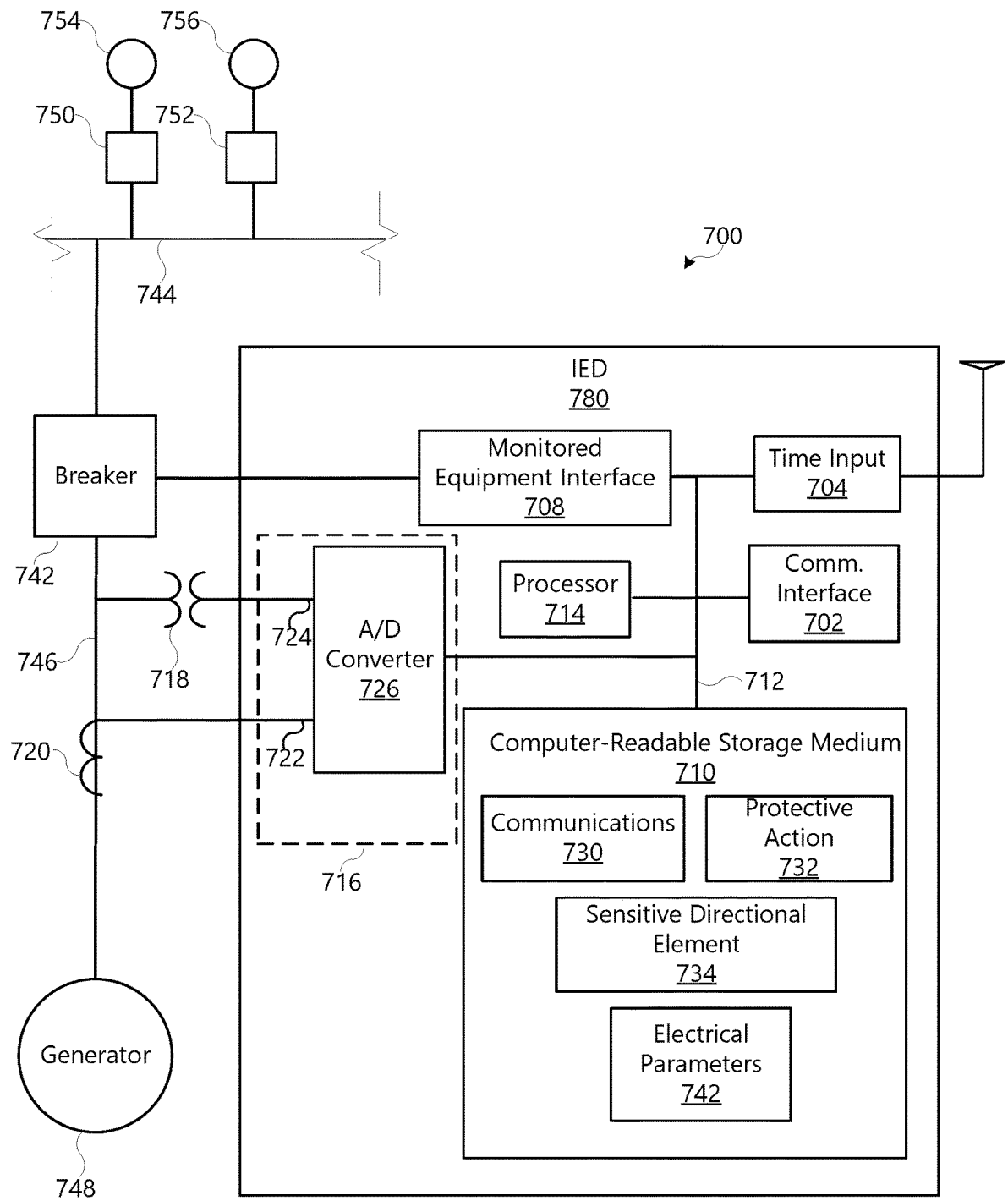
FIG. 7 illustrates a block diagram of a system for providing a protective operation for a high-impedance grounded generator in accordance with several embodiments herein.

FIG. 7 illustrates a block diagram of an electric power system 700 comprising an IED 780 configured to detect a sensitive directional fault associated with a high-impedance grounded generator 748 consistent with embodiments of the present disclosure. In various embodiments, the IED 780 may comprise a generator relay or other device configured to monitor and/or protect the generator 748. The generator 748 may be selectively connected to a feeder 744 using a breaker 742. The feeder 744 may be in electrical communication with an electric power system and generator 748 may provide power to the electric power system via feeder 744.

Additional power system equipment including, for example, equipment 754 and 756 may also be selectively connected to the feeder 744 using breakers 750 and 752, respectively. A fault may occur on any part or piece of equipment on the power system 700. What is needed is an improvement in detecting the location of the fault, especially determining whether the fault is internal to the generator where the generator is high-impedance grounded.

The present disclosure provides a technical solution to the technical problem of detecting a selective directional fault on a high-impedance grounded generator 748 using the IED 780, thus improving the operation of the electric power system 700. In particular, the functioning of the IED 780 is improved by the presently-disclosed sensitive directional fault detection using residual current measurements.

To that end, the IED 780 may include a communications interface 702 configured to communicate with a communication network. The IED 780 may communicate with other IEDs or other devices or systems (e.g., a SCADA system, a wide-area situational awareness system, etc.). The communications interface 702 may be embodied as a network interface, an optical interface, a serial interface, or a variety of other types of communications interfaces. The IED 780 may also include a time input 704, which may be used to receive a time signal from a Navigation Satellite System (GNSS) or other system, such as the WWVB system. In certain embodiments, a common time reference may be received via the communications interface 702, and accordingly, a separate time input 704 and/or a Global time input 706 may not be necessary. One such embodiment may employ the IEEE 1588 protocol.

A monitored equipment interface 708 may be configured to receive equipment status information from, and issue control instructions to a piece of monitored equipment, such as the breaker 742. In some embodiments, the equipment status information and/or control instructions may be communicated over the communication interface 702.

A computer-readable storage medium 710 may be the repository of one or more modules and/or executable instructions configured to implement any of the processes described herein. A data bus 712 may link the monitored equipment interface 708, the time input 704, the communications interface 702, and the computer-readable storage medium 710 to a processor 714.

The processor 714 may be configured to process communications received via the communication interface 702, the time input 704, and/or the monitored equipment interface 708. The processor 714 may operate using any number of processing rates and architectures. The processor 714 may be configured to perform various algorithms and calculations described herein using computer executable instructions stored on the computer-readable storage medium 710. The processor 714 may be embodied as a general-purpose integrated circuit, an application specific integrated circuit, a field-programmable gate array, and/or other programmable logic devices.

In certain embodiments, the IED 780 may include a sensor component 716. In the illustrated embodiment, the sensor component 716 is configured to gather data from a conductor 746 using a PT 718 and a CT 720. The PT 718 may be configured to step-down the voltage (V) on the conductor 746 to a magnitude that can be readily monitored and measured by the IED 780. As described in more detail above, the power system 700 may be a three-phase power system illustrated in the various figures herein. Accordingly, the conductor 746 may be a three-phase line with three conductors, each associated with a different phase. The PT 718 may be in delta or wye configuration to obtain voltage measurements from the line 746. Similarly, the CT 720 may be configured to proportionally step-down a current flowing through the conductor 746 to a magnitude that can be readily monitored and measured by the IED 780. Various other instruments may be used to obtain signals from electric power delivery systems including, for example, Rogowski coils, optical transformers, and the like.

An analog-to-digital converter 726 (A/D converter) may sample and/or digitize the measured voltage and/or current signals to form corresponding digitized current and voltage signals. The A/D converter 726 may be connected to the processor 714 by way of the bus 712, through which digitized representations of current and voltage signals may be transmitted to the processor 714. As described above, the processor 714 may be used to apply equipment status, measurements, and derived values to an IED module. In some embodiments, a separate device may be used in place of a sensor component 716 for providing signals from the conductor 746 to the IED 780. In some embodiments, a separate device may be configured to obtain signals from the electric power delivery system 700 (such as voltage and/or current signals) and create digitized representations of the signals (for example current and voltage signals), apply a time stamp, and/or supply such information to the IED 780. In certain embodiments, the information that has been described as received from the sensor component 716 may be instead received from the communications interface 702.

The monitored equipment interface 708 may be configured to receive status information from, and issue control instructions to a piece of monitored equipment, such as the breaker 742. According to some embodiments, control instructions may also be issued via the communications interface 702. Control instructions issued via the communications interface 702 may be transmitted, for example, to other distributed controllers, coordination controllers, IEDs, or the like (not shown), which in turn may issue the control instruction to a piece of monitored equipment. Alternatively, the piece of monitored equipment may receive the control instruction directly via its own communications interface 702.

The computer-readable storage medium 710 may include instructions for communications 730, protective action 732, determining a direction to a fault using a sensitive directional element 734, and a repository for electrical parameters 742. The modules and/or executable instructions are configured to implement various functions described herein. In one specific embodiment, the modules comprised within computer-readable storage medium 710 may be configured to implement method 500, as illustrated in FIG. 5.

The instructions for the communications 730 may include instructions for facilitating communication of information from the IED 780 to other controllers and/or other components in the electric power delivery system 700. The instructions may include the formatting of communications according to a variety of communication protocols, as well as instructions for communicating information about the direction to the fault to other systems.

The electrical parameters 742 may be configured to receive and monitor electrical parameters associated with the electric power system 700. In the illustrated embodiment, the electrical parameters 742 may be received from a sensor component 716. In other embodiments, the electrical parameters 742 may be received via the communications interface 702. The electrical parameters received by the sensor component 716 may be analyzed by the electrical parameters module to determine other parameters of interest. For example, current measurements may be analyzed to determine a frequency or phase of the electrical energy for purposes of synchronizing rotating machinery 748. Furthermore, nominal values, such as voltage, current, frequency, and the like may be stored in the electrical parameters 742.

The sensitive directional element 734 may include instructions that when executed determine a direction to a fault using incremental residual current according to the various embodiments described herein. For example, the instructions for determining a direction to a fault may compare a difference in incremental residual current quantities against a threshold to determine direction of a ground fault in a high-impedance grounded system; and determining direction based on whether the admittance exceeds a forward or reverse admittance threshold. The sensitive directional element 734 may include instructions that determine other quantities and checks as described in the various embodiments herein.

Instructions for the protective action 732 may be configured to implement one or more actions in which the fault direction calculated in the sensitive directional element 734 indicates a forward or reverse direction to the fault. In various embodiments, the protective action 732 may determine if a protective action should be taken, and affect the protective action by sending a command to equipment useful for affecting the protective action. For example, the protective action may be a disconnection of the generator 748 from the power system 700. In such embodiments, the instructions for the protective action 732 may format and send a command to open the circuit breaker 742. Actions implemented by the protective action instructions 732 may include one or more of opening a circuit breaker, sending a command to another IED that the IED 780 has detected a reverse direction in its sensitive directional element, warning an operator prior to completing the action, and the like.

The embodiments herein may be applied to systems where multiple generators are in electrical connection with a common bus such as the system illustrated in FIG. 3. In such embodiments, separate protective devices may be used to monitor and protect each generator 312, 362. The protective devices may be in communication to share the determination of the direction to the fault using the sensitive current, and use the determinations from both IEDs before taking action. As mentioned above, a forward fault determination may indicate that the fault is internal to the generator windings, whereas a reverse fault determination may indicate that the fault is external to the generator windings. Accordingly, for one IED to positively determine that the fault is internal (forward) to the protected generator, the other IED must also indicate that the fault is external (reverse) to the generator protected by that other IED.

In several embodiments, the multiple-generation fault direction may be determined by blocking a forward fault direction in one IED when a forward fault direction is determined by the other IED. Similarly, in certain embodiments the forward fault direction of one generator may be determined only when a reverse fault direction of the other generator is determined.

Figure 8:
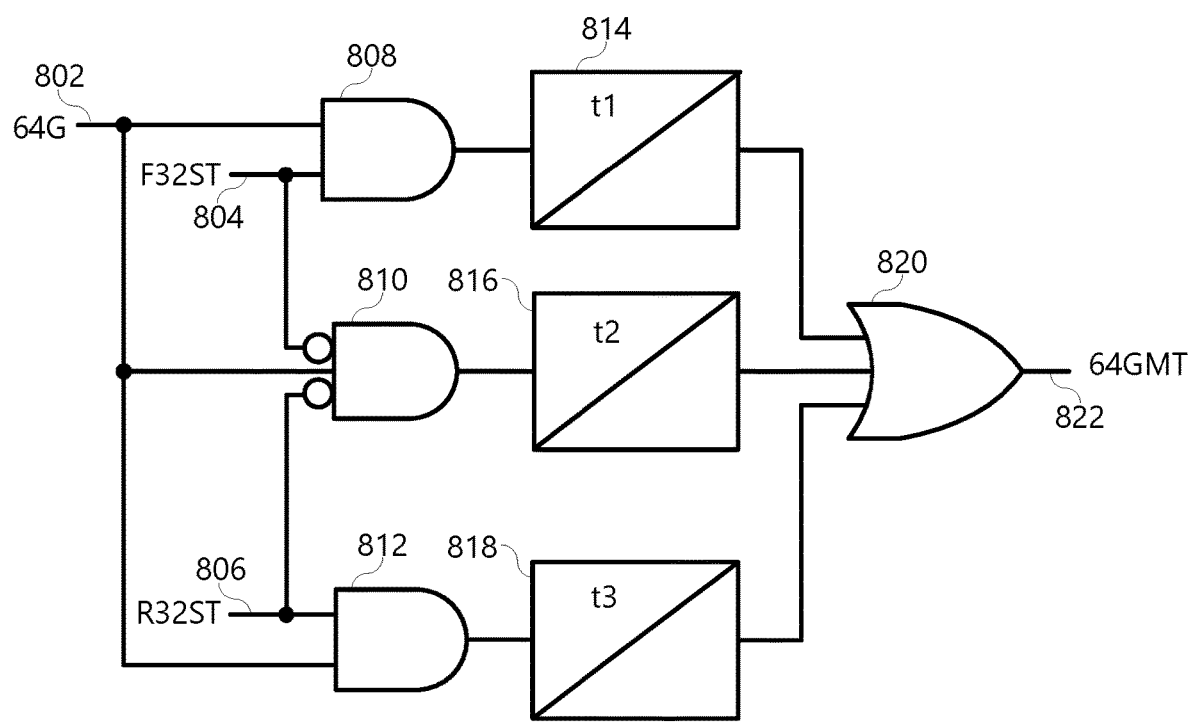
FIG. 8 illustrates a simplified logic diagram of sensitive directional protection for multiple high-impedance grounded generators in accordance with several embodiments herein.

FIG. 8 illustrates a simplified logic diagram of sensitive directional protection for multiple high-impedance grounded generators in accordance with several embodiments herein. The 64G input by itself indicates that there is a ground fault detected but does not provide selectivity. That is, the 64G input does not include information as to which generator is faulted. The 64G input may be asserted by other protection logic or elements such as a ground fault detector. The method illustrated in FIG. 8 provides for selective fault detection and tripping (protective action, or fault clearing) according to several embodiments herein. Forward fault signals and reverse fault signals may be used in combination with a ground fault signal 64G 802 to selectively determine a faulted generator. Forward fault signal F32ST 804 and reverse fault signal R32ST 806 are then used with the ground fault signal 64G 802 to assert a selective trip signal 64GMT 822. In particular, an AND gate 808 asserts to a timer 814 when the ground fault signal 64G 802 is asserted and the forward fault signal F32ST 804 is asserted. An AND gate 810 asserts to a timer 816 when the ground fault signal 64G 802 is asserted, and neither the forward fault signal F32ST 804 nor the reverse fault signal R32ST 806 are asserted. An AND gate 812 asserts to a timer 818 when the ground fault signal 64G 802 is asserted and the reverse fault signal R32ST 806 is asserted. If the respective AND gate 808, 810, 812 asserts for the predetermined times of the timers 814, 816, 818, then the timers 814, 816, 818 will assert to an OR gate 820, which then will assert the output 64GMT 822 allowing for a selective trip. The logic of FIG. 8 describes a tripping sequence that allows the relay to detect and clear a forward fault to trip first via short timer t1 814, followed by the longer timer t2 816 when the fault direction is unknown, followed by the longest timer t3 818 when the fault direction is determined to be reverse. The outputs from the timers 814, 816, 818 are combined via an OR gate 820, and the output 64GMT 822 allows the relay to issue a selective trip. Note that the timer values t1, t2, and t3 are configurable by the user. The timer value of t1 is configured to be secure and the difference t2−t1 and t3−t2 provides the required coordination-achieving selectivity. The timers 814, 816, 818 may be simple pickup/dropout timers or special integrating or sequencing timers that remain dependable for intermittent faults.

In another embodiment, a communications channel may be used to bias the tripping scheme so that the most likely faulted unit is tripped first, followed by less likely ones. For example, of the generators G1 312 and G2 362 of FIG. 3, a bias may be used to trip the generator that is most likely faulted, and then trip the other generator (for example, if tripping the first generator did not clear the fault). Upon determining that a fault is present as described in the various embodiments herein, the IED may issue a trip command to cause a circuit breaker to open to prevent the generator from continued operation during the fault. In situations with more than one generator, according to one technique, the circuit breakers may be tripped in a pre-determined order. For example, a first IED of a first generator may be preset to trip a circuit breaker at a first time, a second IED of a second generator may be preset to trip a circuit breaker at a second time, after the first time, etc. When the fault is isolated from the common bus then the generator causing the fault has been determined. However, such pre-determined orders may be inefficient and/or cause delays in isolating the fault from the common bus. Accordingly, the IED may utilize a technique to determine a likelihood that a fault is located at a particular generator. The IED may send and receive the determined likelihoods to and from the other IEDs. Further, the IED may determine an order in which to trip circuit breakers based on the likelihoods.

FIGS. 9A, 9B, 9C, 9D, and 9E illustrate simplified logic diagrams of elements of a directional protection system for a high-impedance grounded generator in accordance with several embodiments herein. Various embodiments consistent with the present disclosure may provide various features, such as secure neutral side protection via the 64G3M element, selective neutral side selectivity using the 64GMMS element that compares the third-harmonic and fundamental voltages, and selective terminal side selectivity using the sensitive directional element (67S). Such embodiments may use a current measurement from a residual or core-balance CT at the generator terminals.

The polarizing voltage magnitude (67SVPM) and angle (67SVPA) may be determined by the 67SV setting. Eq. 5 may be used to establish various values.

$$\text{IF } 67SVP = VN \qquad \text{Eq. 5}$$

$$67SVPM = 3 * VNFM$$

$$67SVPA = VNFA - V1ZA$$

$$PTRVP = PTRV2$$

$$\text{ELSE } (67SVP = 3V0Z)$$

$$67SVPM = 3V0ZFM$$

$$67SVPA = 3V0ZFA + 180° - V1ZA$$

$$\text{IF } PTCONZ = D1$$

$$PTRVP = PTRZ2$$

$$\text{ELSE } (PTCONZ$$

$$= Y, \text{not } D \text{ based on setting rules})$$

$$PTRVP = PTRZ$$

The 67SVPF phasor quantities may be created with magnitude 67SVPF and angle 67SVPA.

The operating current magnitude (67SIOM) and angle (67SIOA) may be determined by the 67SIO setting. Eq. 6 may be used to establish certain quantities.

$$\text{IF } 67SIO=Y[k]$$

$$67SIOM=IY[k]FM$$

$$67SIOA=IY[k]FA$$

$$CTRIO=CTRY[k]$$

$$\text{ELSE } (67SIO=m)$$

$$67SIOM=3I0[m]FM$$

$$67SIOA=3I0[m]FA-V1ZA$$

$$CTRIO=CTR[m] \qquad \text{Eq. 6}$$

The 67SIOF phasor quantity may then be created with magnitude 67SIOM and angle 67SIOA.

Figure 9A:
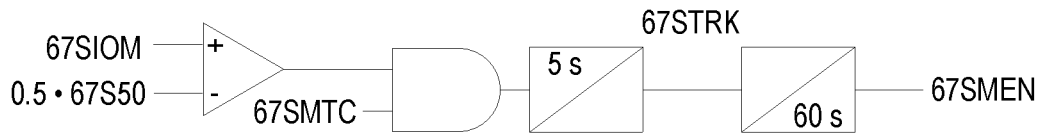
FIGS. 9A, 9B, 9C, 9D, and 9E illustrate simplified logic diagrams of elements of a directional protection system for a high-impedance grounded generator in accordance with several embodiments herein.

Memory-based incremental logic is enabled based on the logic shown in FIG. 9A. A standing phasor error may be tracked based on the status of 67STRK and 67SMEN as follows:

If 67STRK is asserted, the phasor may be tracked using

Else if 67SMEN is de-asserted, set 67SIOFE to zero.

Else if 67SMEN is asserted and 67STRK is de-asserted, 67SIOEi=67SIOEi−1. Eq. 7.

$$67SIOE_i = 67SIOE_{i-1} + \left(\frac{67SIOF_i - 67SIOE_{i-1}}{1000}\right) \qquad \text{Eq. 7}$$

The magnitude of 67SIOE is 67SIOEM and the angle is 67SIOMA. If 67SMEN is asserted, calculate the compensated operating current phasor 67SIOC may be calculated using Eq. 8. If 67SMEN is de-asserted, 67SIOC=67SIOF.

$$67SIOC=67SIOF-67SIOE \qquad \text{Eq. 8}$$

The magnitude of 67SIOC is 67SIOCM and the angle is 67SIOCA.

Figure 9B:
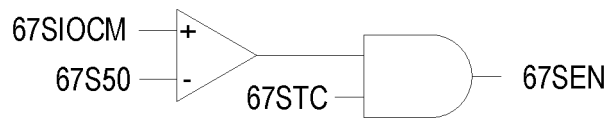

An admittance calculation is enabled (67SEN) based on the logic of FIG. 9B. If 67SEN is asserted, the primary admittance may be calculated using Eq. 9. Otherwise, if 67SEN is de-asserted, Y0 may be set to 0.

$$Y0 = \left(\frac{1000 \cdot CTRIO}{PTRVP}\right) \cdot \text{Re}\left(\frac{67SIOC \cdot e^{j(ZC0ANG)}}{67SVPF}\right) \qquad \text{Eq. 9}$$

Figure 9C:
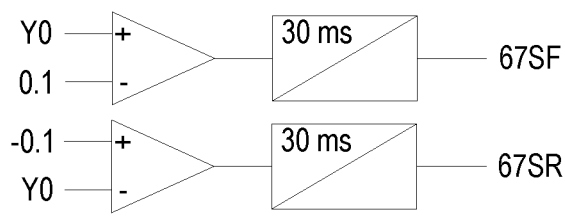
Figure 9D:
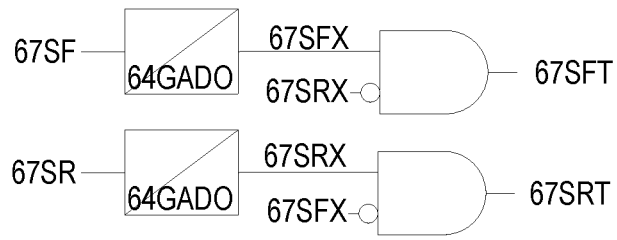

The logic of FIG. 9C may be used to determine 67SF (forward) and 67SR (reverse) values. The logic of FIG. 9D may condition the output from the 67S element. The analog quantity 67ST is calculated using Eq. 10.

If 67SRT=1,67ST=0

Else If 67SFT=1,67ST=1

Else 67ST=0.5 Eq. 10

Figure 9E:
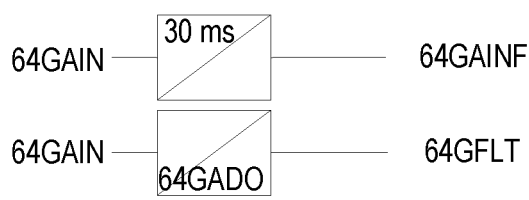

FIG. 9E shows logic that may condition the output of the 64GMMS element. The analog quantity 64GMMS is calculated using Eq. 11. Both 67ST and 64GMMST are values that range from 0 to 1 inclusive.

If 64GFLT is de-asserted, 64GMMST=0

Else If (64GAINF is asserted AND 64GMMS>64GMMST)

64GMMST=64GMMS Eq. 11

The analog quantity BIAS may be calculated using Eq. 12 to obtain a value from 0 to 100.

BIASRAW=66.67·67ST+33.33·64GMMST

If 33.34<BIASRAW<33.50

Bias=34

Else If 66.50<BIASRAW<66.66

Bias=66

Else

Bias=ROUND(BIASRAW) Eq. 12

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed:

1. A system for protecting an electric power generation installation in an electric power delivery system, comprising:
   a protective device in electrical communication with a generator of the electric power generation installation, comprising:
      a voltage sensor component to obtain a voltage signal corresponding with a voltage of the first generator of the electric power generation installation;
      a current sensor component to quantify a measured current;
      a processor; and
      a computer-readable storage medium in communication with the processor, the voltage sensor component, and the current sensor component, comprising instructions that when operated cause the processor to:
         calculate a pre-fault standing error current using a measured current and a measured reference positive-sequence voltage;
         store the standing error reference on the computer-readable storage medium;
         detect a ground fault using voltage signals from the voltage sensor component;
         calculate an operating current by calculating a difference between the measured current and the pre-fault standing error current;
         determine a direction to the ground fault based on the difference between the measured current and the pre-fault standing error current; and
         implement a protective action based on the direction to the ground fault.

2. The system of claim 1, wherein the standing error reference value is utilized each time the operating current is calculated.

3. The system of claim 1, wherein the current sensor component comprises a windowed CT.

4. The system of claim 3, wherein the windowed CT comprises a core-balanced windowed CT.

5. The system of claim 1, further comprising a plurality of current sensors to electrically couple to each of a plurality of phases.

6. The system of claim 1, wherein the instructions of the computer-readable storage medium further cause the processor to utilize the reference current to determine a residual sensitive current by determining a deviation of the reference current resulting from the ground fault.

7. The system of claim 1, wherein the instructions of the computer-readable storage medium further cause the processor to determine a direction to the fault as forward to the first generator only when a magnitude of the residual current exceeds a predetermined threshold.

8. The system of claim 1, further comprising a high-impedance grounding element.

9. The system of claim 1, further comprising a second protective device in electrical communication with a second generator of the generator installation, the first and second generators in electrical communication with a common generation bus.

10. The system of claim 1, wherein the direction to the ground fault is further determined based on a comparison of the reference current and a measured neutral voltage.

11. A method for protecting an electric power generation installation in an electric power delivery system, comprising:
    obtaining, using a voltage sensor component, a voltage signal proportional to a voltage of a generator of the electric power generation installation;
    quantifying, using a current sensor component, a measured current;
    calculating, using a processor, a pre-fault standing error current using a measured current and a measured reference positive-sequence voltage;
    storing, using a computer-readable storage medium, the standing error reference;
    detecting, using the voltage sensor component, a ground fault using voltage signals from the voltage sensor component;
    obtaining, using a a measured current
    calculating an operating current by calculating a difference between a measured current and the pre-fault standing error current;
    determining a direction to the ground fault based on the difference between the measured current and the pre-fault standing error current; and
    implementing, using a protective device, a protective action based on the direction to the ground fault.

12. The method of claim 11, further comprising utilizing the standing error reference value utilized each time the reference current is calculated.

13. The method of claim 11, wherein current sensor component comprises a windowed CT.

14. The system of claim 13, wherein the windowed CT comprises a core-balanced windowed CT.

15. The system of claim 11, further comprising receiving measurements from a plurality of current sensors electrically coupled to each of a plurality of phases.

16. The method of claim 11, further comprising utilizing the reference sensitive current to determine a residual current by determining a deviation of the reference current resulting from the ground fault.

17. The method of claim 11, further comprising determining a direction to the fault as forward to the first generator only when a magnitude of the residual current exceeds a predetermined threshold.

18. The method of claim 11, grounding the first generator with a high-impedance grounding element.

19. The method of claim 11, further comprising providing a second protective device in electrical communication with a second generator of the generator installation, the first and second generators in electrical communication with a common generation bus.

20. The method of claim 11, wherein the direction to the ground fault is further determined based on a comparison of the reference current and a measured neutral voltage.

* * * * *